(12) United States Patent
Vester et al.

(10) Patent No.: US 10,935,615 B2
(45) Date of Patent: Mar. 2, 2021

(54) MAGNETIC RESONANCE IMAGING WITH SPATIAL ENCODING BY FAST MOVING OR VIBRATING MAGNETIC FIELD GENERATOR COMPONENTS

(71) Applicants: Siemens Healthcare GmbH, Erlangen (DE); Yale University, New Haven, CT (US)

(72) Inventors: Markus Vester, Nuremberg (DE); Peter Speier, Erlangen (DE); Stefan Popescu, Erlangen (DE); Edgar Mueller, Heroldsbach (DE); Robert Todd Constable, Madison, CT (US); Gigi Galiana, New Haven, CT (US)

(73) Assignees: Yale University, New Haven, CT (US); Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/366,830

(22) Filed: Mar. 27, 2019

(65) Prior Publication Data

US 2020/0309877 A1    Oct. 1, 2020

(51) Int. Cl.
*G01V 3/00*      (2006.01)
*G01R 33/38*     (2006.01)
*G01R 33/383*    (2006.01)

(52) U.S. Cl.
CPC ....... *G01R 33/3802* (2013.01); *G01R 33/383* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

| | | | |
|---|---|---|---|
| 2004/0183778 A1* | 9/2004 | Endo ..................... | G06F 3/0338 345/156 |
| 2011/0075122 A1* | 3/2011 | Hol ..................... | G03F 7/70758 355/72 |

OTHER PUBLICATIONS

WO 2018/106760 A1, Wan, MRI System Using Non-Uniform Magnetic Fields, Jun. 14, 2018.*
Relaxation Times PDF downloaded Apr. 15, 2020.*

* cited by examiner

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

A magnet assembly for magnetic resonance imaging is used to generate the basic magnetic field with a strength needed to produce the steady state or equilibrium position of nuclei or nuclear spins in magnetic resonance imaging. This magnet, or a part thereof, is vibrated or tilted or otherwise periodically moved so as to change its position and thereby generate a time-varying gradient field, which is used to enter the acquired magnetic resonance signals as raw data into k-space.

22 Claims, 4 Drawing Sheets

MAGNETIC RESONANCE IMAGING WITH SPATIAL ENCODING BY FAST MOVING OR VIBRATING MAGNETIC FIELD GENERATOR COMPONENTS

BACKGROUND OF THE INVENTION

Field of the Invention

The present invention concerns the field of magnetic resonance imaging (MRI). More specifically, the present invention concerns MRI apparatuses and imaging methods wherein the basic field magnet is also operated so as to spatially encode the magnetic resonance signals (raw data) that originate from the examination subject.

Description of the Prior Art

Magnetic resonance imaging is a known imaging modality that has achieved widespread use for many purposes in the medical field, as well other fields wherein the interior, or the composition of an examination subject are to be examined or evaluated.

In very general terms, a magnetic resonance imaging apparatus operates by placing the examination subject in a strong and highly uniform basic magnetic field, having a field strength of up to several Tesla or more. This strong basic magnetic field causes nuclei in the examination subject to become oriented along the field lines of the basic magnetic field. This is commonly called the steady state of the nuclei.

Radio-frequency (RF) energy, usually in the form of RF pulses, is radiated into the examination subject. The RF energy causes certain nuclei (nuclear spins) in the subject to resonate. The nuclei spins are given a magnetization dependent on attributes of the RF energy, so that these nuclear spins are deflected from the steady state or equilibrium position by an amount known as the flip angle, and as these excited nuclear spins relax and return to the steady state, they emit RF signals, called magnetic resonance (MR) signals. These signals are detected by the same or different RF antennas from which the RF energy was radiated, and are entered into respective data points of a memory, as so-called k-space data.

In order to identify the point of origin of each detected MR signal, magnetic field gradients are produced during the aforementioned procedure, which spatially encode the MR signals. Conventionally, these gradient fields have been produced by a set of gradient coils, usually three individually controlled gradient coils that respectively produce orthogonal gradients along the respective axes of a Cartesian coordinate system. These gradient axes also determine the axes of the memory into which the k-space data are entered. Entering the received MR signals at the respective data points in the memory is referred to as scanning or filling k-space, and the aforementioned gradients also define the path (trajectory) in k-space along which the respective available data points are filled (scanned).

The acquired data are also commonly referred to as raw data, and must be transformed into image data in order to produce an image of the region or volume of the examination subject from which the raw data originated. The raw data are transformed into image data by a Fourier transformation in a procedure known as image reconstruction. The reconstructed image is then available for viewing on a display screen, or archiving in a memory as datafile.

The speed with which the respective data entries are entered into the k-space memory is proportional to the gradient vector grad(B), i.e.:

$$dk/dt = \gamma \mathrm{grad}(B)$$

wherein $\gamma$ is a proportionality factor. A higher gradient strength allows data to be entered into k-space faster, thereby reducing the total time required for acquiring the image data, and thereby reducing the time that the patient must spend in the MR scanner.

In conventional systems making use of dedicated gradient coils for generating the gradient fields, each gradient coil is operated an individual gradient amplifier. In order to achieve a high gradient field strength, such as 50 mT/m, a high current, amounting to several hundred amperes, is needed, which requires large and expensive gradient amplifiers, and results in significant power (many kilowatts) being dissipated in the gradient coils.

Published PCT application WO 2018/106760 A1 discloses an MRI system using non-uniform magnetic fields, wherein the basic field magnet, which is used to generate the basic magnetic field in the MRI scanner, is also operated so as to generate a spatially non-uniform magnetic field within the imaging region. An electromagnet is used as the basic field magnet in this system. The current through the electromagnet is controlled in order to repeatedly cycle the non-uniform magnetic gradient field between a high strength, for polarizing the nuclear spins, and a low strength, for spatial encoding and readout of the MR signals. Therefore, no separate gradient coils are used in that system.

The electromagnet used in this known system is called a one-sided or "flatbed" magnet, which allows for a more open structure of the MR scanner, with improved patient accessibility, and with a less confining environment for the patient.

SUMMARY OF THE INVENTION

Conventionally, the static magnetic field gradient produced by the one-sided magnet described above provides movement through k-space with a fixed velocity and direction, and thus by itself is not sufficient to scan an area or a volume in k-space.

For such single-sided magnets, the gradients are typically so high that RF pulses can excite only thin curved slices. The static field shapes these signal-generating volumes around isocontour planes of the static field. The volume thickness in in frequency units is roughly equal to the bandwidth of the RF excitation pulses. Typically, multi-echo CPMG (Carr-Purcell-Meiboom-Gill) sequences or similar B0 and B1 imperfection-compensating sequences are used to optimize the signal-to-noise ratio (SNR) and spatial encoding, or to provide a contrast dimension. The RF refocusing pulses of these sequences periodically invert the k-space encoding, generating a train of echoes. Without in-plane encoding, the echo shape is determined by the slice profile of the static field direction. To efficiently encode in-plane information in a single echo, i.e., to change the echo shape, the in-plane k-space velocity must be controlled simultaneously with the through-plane k-space velocity, and the gradients in both those directions must also be controlled. It is therefore an object of the present invention to provide a magnet arrangement wherein the in-plane k-space velocity is modifiable (controlled).

Typical echo sequences require the k-space position at the time of the refocusing RF pulses to be constant, otherwise the signal is lost quickly. This means that the in-plane encoding that is applied after a refocusing pulse must be identical for all echoes of an echo train, which would mean that only one k-space line can be sampled per excitation, or the in-plane encoding must be dismantled between pulses, which requires that the gradient pulse be inverted. A further goal of the present invention is to provide a gradient variation that can be synchronized with the pulse sequence.

These objects are achieved in accordance with the present invention by using electromechanical actuators to modify the shape or relative position of a magnet, or a magnet component, over time. This can be implemented as a translational movement, a tilt, or rotation through small angles, or full rotation, or even by elastic reshaping.

For fast image acquisition, the modifications in the magnet configuration should be able to be implemented in a time scale that is smaller than the relevant spin relaxation times T2 and T1. This means that the change in shape or relative position of the magnet or magnet components must take place in a time duration that is less than 100 ms or, if expressed in terms of frequency of the change, greater than 10 Hz. Ideally for spin echo sequences, the modification should be synchronized with the pulse sequence, for the reasons noted above.

DESCRIPTION OF THE PREFERRED EMBODIMENTS

Figure 1:
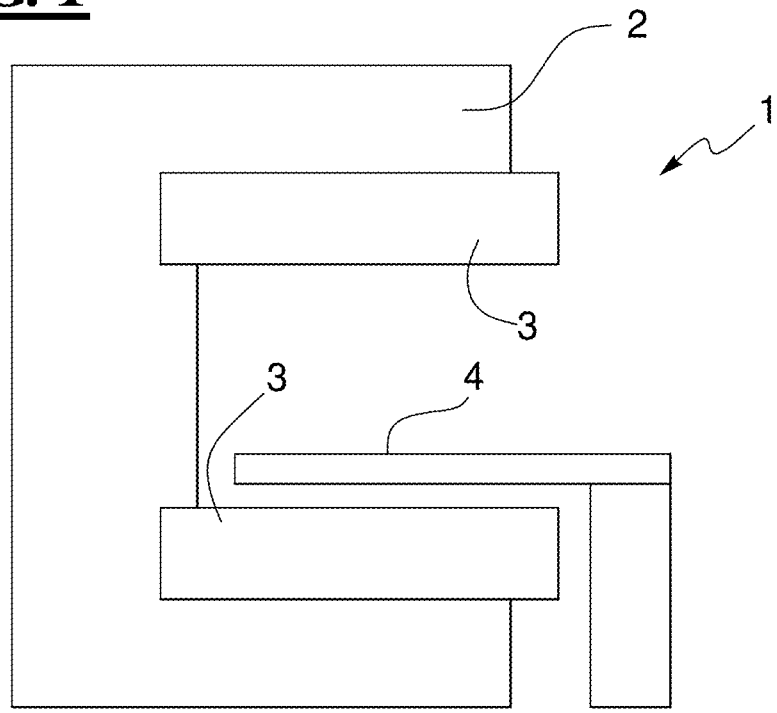
FIG. 1 is a side elevational view of a conventional open MRI scanner.

FIG. 1 is a side elevational view of a conventional open MRI scanner 1, which has a generally C-shaped housing 2, to which two magnets 3 are mounted, with a patient-receiving space therebetween. A patient is situated in the patient-receiving space on a patient table 4.

The magnets 3 in such an open MRI scanner 1 are typically permanent magnets or electromagnets, and produce, in combination, the basic magnetic field for MRI in the patient-receiving space. The magnets may be connected by a yoke.

Figure 2:
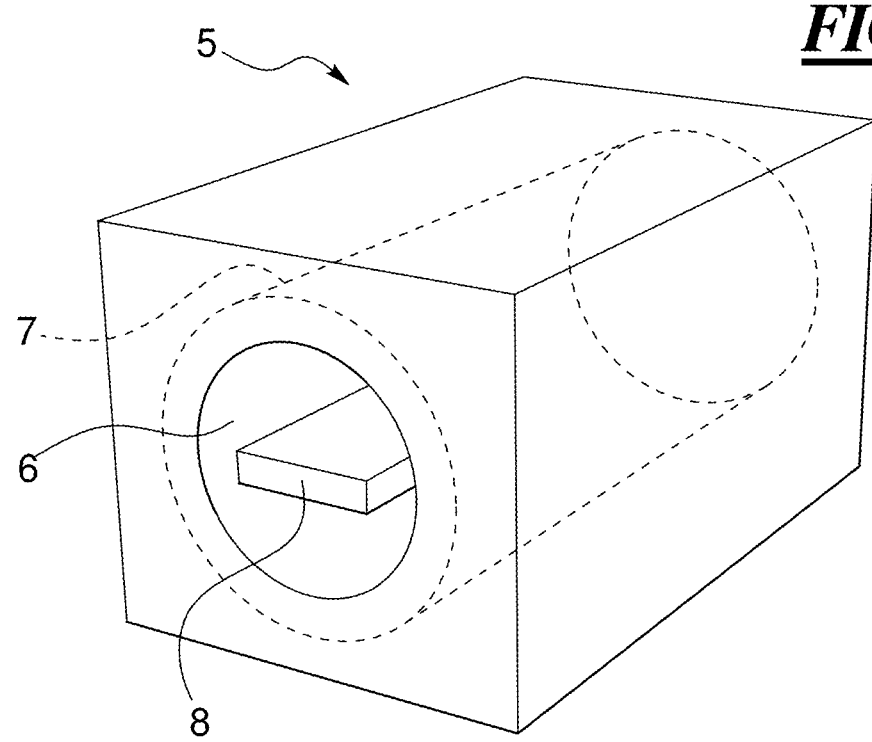
FIG. 2 is a perspective, schematic view of a conventional MRI scanner with a patient tunnel surrounded by the scanner housing.

FIG. 2 schematically illustrates a tunnel-type MRI scanner 5, which has a housing or shell with a patient-receiving tunnel or receptacle 6 proceeding therethrough. The tunnel 6 is surrounded by a hollow-cylindrical basic field magnet 7, and the patient is moved into and out of the tunnel 6 on a patient table 8. In MRI scanners of this type, the basic field magnet 7 is typically a superconducting magnet, formed by a number of superconducting coils. The coils are contained in a cryostat in order to produce and maintain the superconducting state.

The present invention can also be used in the aforementioned "flatbed" type of MRI scanner.

Figure 3:
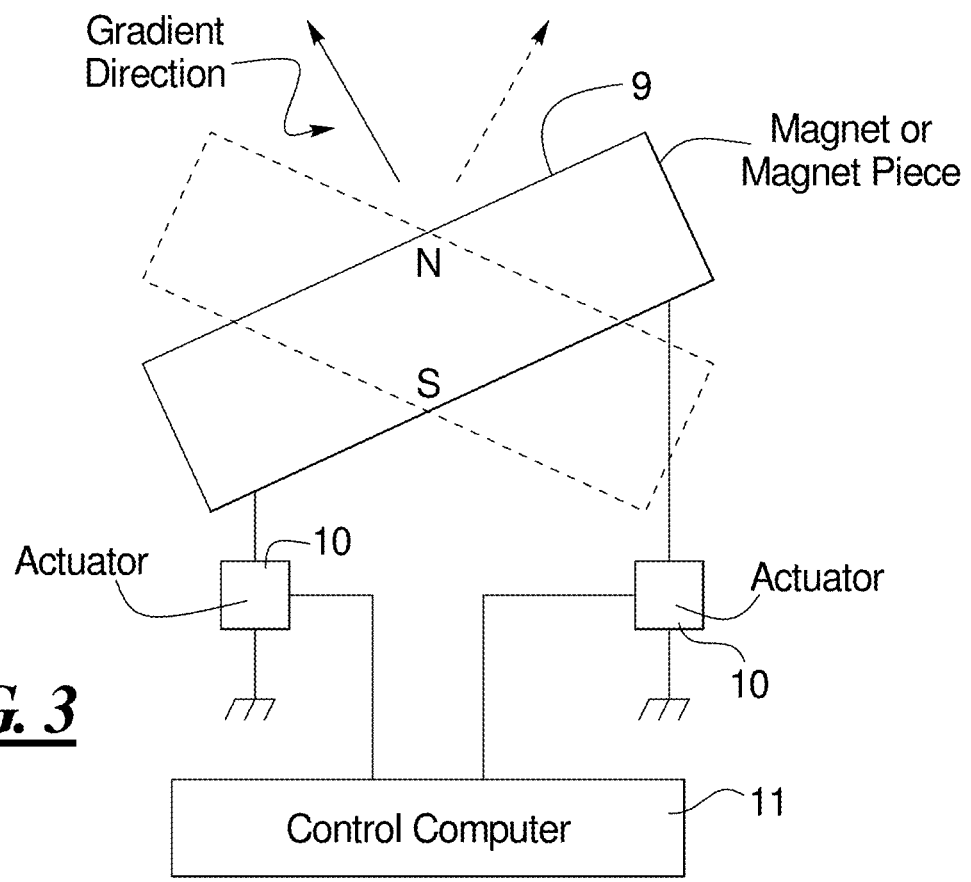
FIG. 3 is a schematic illustration of a first embodiment of the magnet arrangement according to the invention.

FIG. 3 schematically illustrates a first embodiment of a magnet arrangement according to the invention. In this embodiment, the entire magnet or a magnet piece thereof, designated by reference numeral 9, is tilted laterally up and down, on opposite sides, by respective actuators 10, operated by a control computer 11. When the magnet or magnet piece 9 is in the position indicated by the solid lines, it produces a gradient field in the gradient direction indicated by the solid-line arrow. When the magnet or magnet piece 9 is in the position indicated by the dashed lines, it produces a gradient field with the gradient direction indicated by the dashed-line arrow.

The magnet or magnet piece 9 is also operated in the conventional manner so as to produce the necessary strong basic magnetic field that is needed for establishing the steady state or equilibrium position of nuclei or nuclear spins for magnetic resonance imaging.

Figure 4:
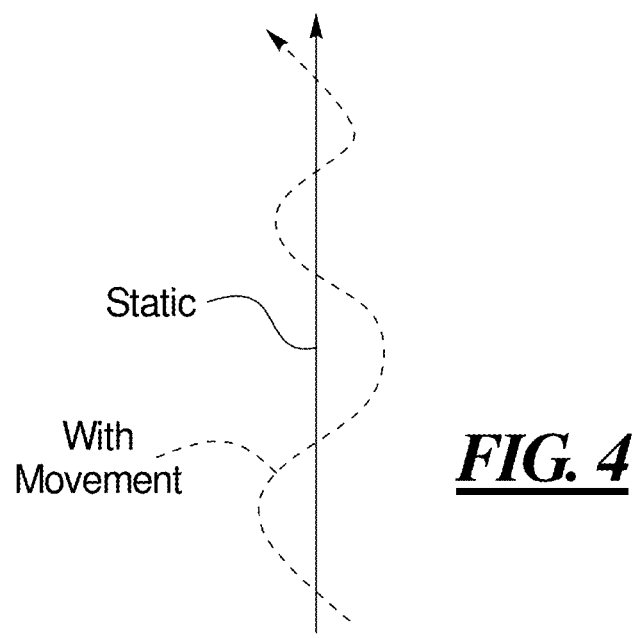
FIG. 4 illustrates an example of wiggle pattern produced as a k-space trajectory in accordance with the invention, compared to the conventional straight line k-space trajectory.

The operation of the magnet system shown in FIG. 3 produces a trajectory of data points in k-space having a wiggle pattern, as shown by the dashed trajectory in FIG. 4. This is compared with the straight line trajectory produced by a static gradient field, as indicated by the solid line in FIG. 4. The dashed-line trajectory produced in accordance with the invention encompasses more data points in the same time frame as the data points of the static trajectory, by providing spatial information in another direction.

Using additional actuators 10, gradient fields in different directions can also be generated.

The base or crowned connection that is schematically indicated for the actuators 10 in FIG. 3 can be a part of the housing or shell 2 of the open MRI scanner shown in FIG. 1, or can be the base of a "flatbed" arrangement.

Figure 5:
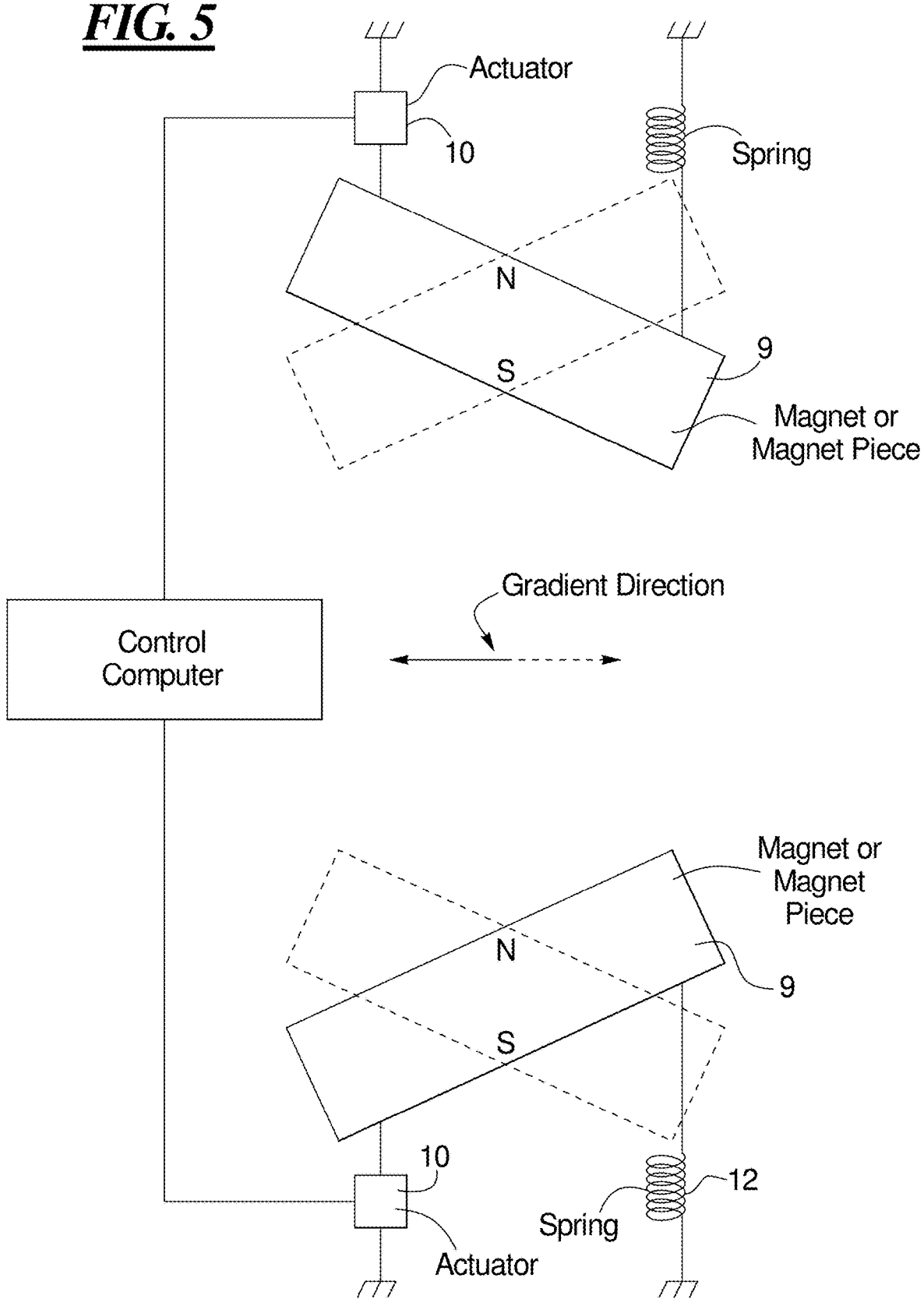
FIG. 5 schematically illustrates another embodiment of the magnet arrangement according to the invention.

Another embodiment of the magnet system according to the invention is shown in FIG. 5, wherein two magnets or magnet pieces 9 are used, such as in the open MRI scanner 1 shown in FIG. 1. In this embodiment, each magnet or magnet piece 9 is moved or tilted by only one actuator 10, and the opposite side is connected to a spring. The magnet or magnet pieces 9 shown in FIG. 5 are symmetrically arranged so as to produce a gradient having the respective gradient directions shown by the solid and dashed arrows in FIG. 5.

In a middle position, the gradient contributions from the bottom and top magnets or magnet pieces 9 will cancel, whereas tilting both of the magnets or magnet pieces 9 in antiphase can generate balanced positive and negative gradients along the horizontal direction, as shown.

Mechanical self-resonances, such as using an elastic spring, can be exploited in order to achieve large vibrational amplitude with a small driving force. Different self-resonant frequencies can be excited simultaneously so as to achieve 2D or 3D coverage of k-space, such as in a Lissajous pattern.

The vibrations may emit small, unwanted acoustic noise, and therefore it is preferable to use low vibration frequencies, such as between 10 and 200 Hz, which is a frequency range in which the human ear is not very sensitive.

It is also possible, however, to consider very fast vibrations, even in the ultrasound range, i.e., greater than 15 kHz. This would be less efficient, however, because the accumulated gradient integral change over one-half period (and thus movement in k-space) will be much smaller. Moreover, the rate of flux change of the basic magnetic field (Db/tt) will have to be large and thus care may need to be taken in order to avoid nerve stimulation in the patient.

The entire basic field magnet can be moved, but this means that a large mass would have to be moved quickly, but only relative to the weak earth's magnetic field, or an artificial weak external field, which could be homogenous. The angle between the external field and the static field generated by the assembly changes with position relative to the assembly, thereby generating a position-dependent static sum field. By changing the position or orientation of the assembly, the field can be spatially modulated.

Figure 6:
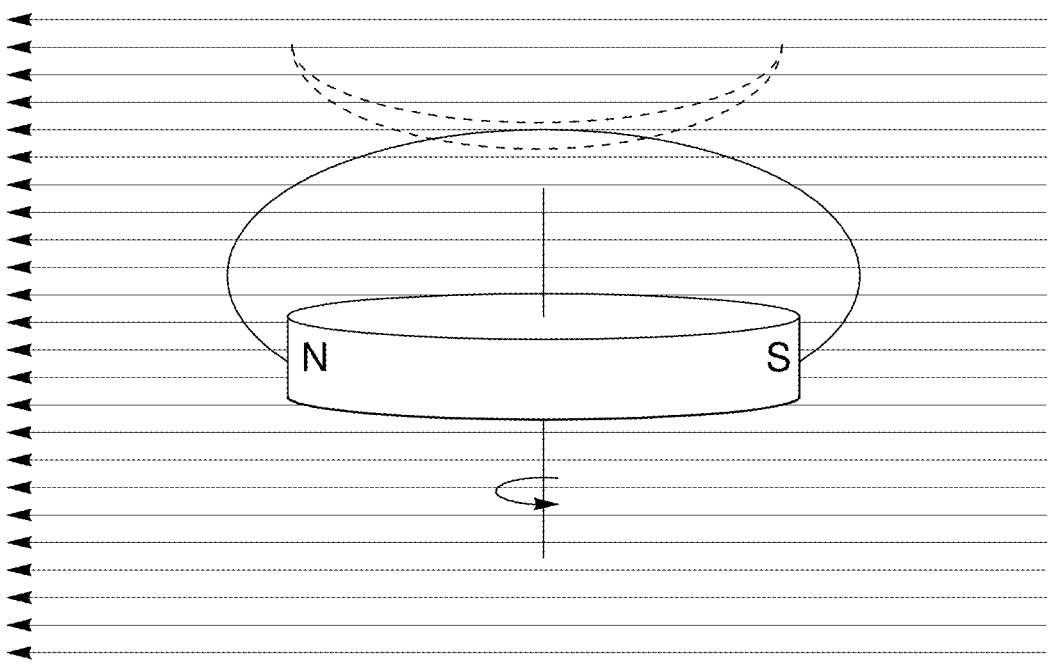
FIG. 6 schematically illustrates an embodiment of the magnet arrangement according to the invention with rotation of the magnet.

FIG. 6 schematically illustrates a magnet rotating in the weak earth's magnetic field, which generates a spatial field modulation within an isocontour volume of the magnetic field.

Figure 7:
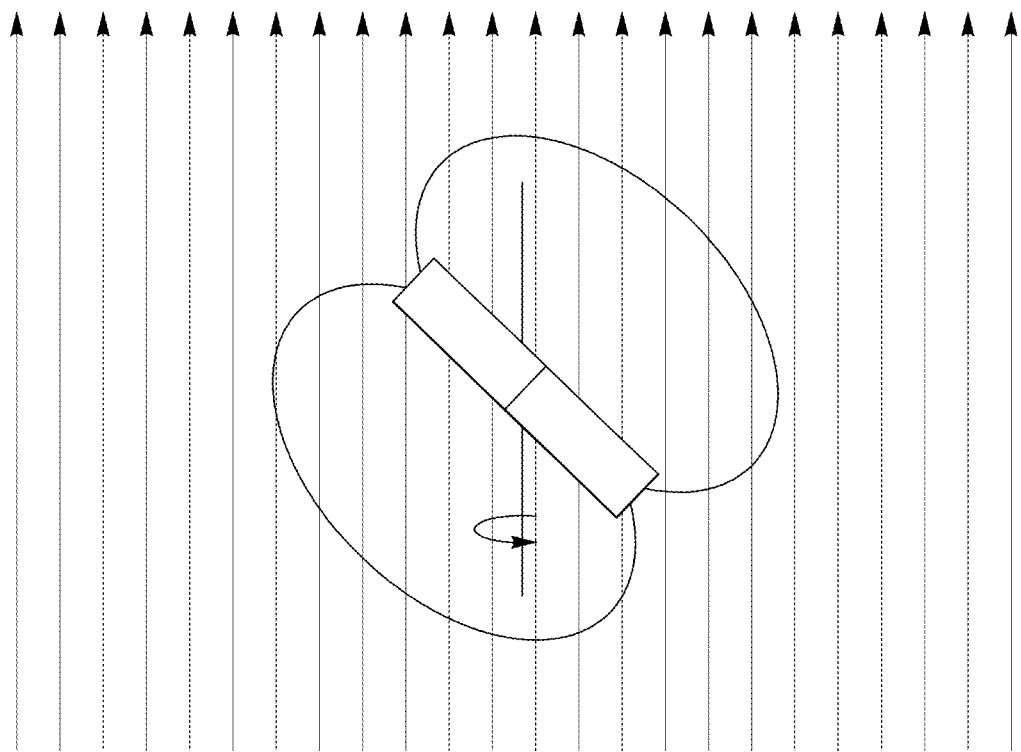
FIG. 7 illustrates a dipole magnet rotating without an energy change in the basic magnetic field.

An alternative to moving the entirety of the basic field magnet is to move only a smaller, and thus much lighter, part of the overall magnet, in order to shape the gradient field. This movable part will experience strong torque and translational forces in the magnetic field generated by the other, static parts of the magnet assembly. To ensure that the motion is smooth and does not require excessive force, it is advantageous to use a motion that does not change the energy of the assembly. This will mean that the relevant forces act only on the bearings of the moving part. An example of such a motion is a dipole magnet oriented obliquely relative to the static field direction, as shown in FIG. 7, which is rotated around the static field direction without changing the angle between the static field direction and the dipole access. Again, the superposition of the rotating dipole and the static field generates a spatial modulation that changes over time, and can be used for k-space encoding.

Although described above in the context of magnets that resemble the magnets in the open system shown in FIG. 1, the invention can also be used with a cylindrical magnet in a scanner of the type shown in FIG. 2, with this cylindrical magnet then being rotated, for example, in order to achieve the directional change. Again, it is not necessary to change the direction of the entire cylindrical magnet; smaller components thereof can be separated and individually rotated. Tilting is also possible in this embodiment, in order to achieve the desired directional change.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance imaging (MRI) apparatus comprising:
an MRI scanner comprising a magnet that generates a basic magnetic field in an imaging volume of the MRI scanner, said basic magnetic field having a field strength that establishes a steady state of nuclei in a subject situated in the imaging volume;
an actuator assembly that mechanically periodically alternates a position of at least a part of said magnet between two positions, so as to cause said at least part of said magnet to produce a time-varying gradient magnetic field that encodes magnetic resonance signals produced in said MRI scanner by nuclei in said subject that have been excited to resonance in an MRI data acquisition procedure executed by said MRI scanner; and
a computer that controls operation of said MRI scanner and said actuator assembly in said MRI data acquisition procedure so as to enter said magnetic resonance signals into a memory organized as k-space along a time-varying trajectory defined by said encoding.

2. An MRI apparatus as claimed in claim 1 wherein the excited nuclei have a spin relaxation time associated therewith, and wherein said alternation of said position of said at least a part of said magnet by said actuator assembly takes place in a duration that is smaller than said spin relaxation time.

3. An MRI apparatus as claimed in claim 1 wherein said alternation of said position of said at least a part of said magnet by said actuator assembly takes place in a duration of less than 100 ms.

4. An MRI apparatus as claimed in claim 1 wherein said alternation of said position of said at least a part of said magnet by said actuator assembly takes place with a frequency greater than 10 Hz.

5. An MRI apparatus as claimed in claim 1 wherein said alternation of said position of said at least a part of said magnet by said actuator assembly takes place with a frequency in a range between 10 and 200 Hz.

6. An MRI apparatus as claimed in claim 1 wherein said alternation of said position of said at least a part of said magnet by said actuator assembly takes place with a frequency greater than 15 kHz.

7. An MRI apparatus as claimed in claim 1 wherein said magnet is a flat magnet, and wherein said actuator assembly alternates said position of parts of said flat magnet by tilting said flat magnet.

8. An MRI apparatus as claimed in claim 7 wherein said MRI scanner comprises a scanner housing, and wherein said actuator assembly comprises two separate actuators respectively disposed at opposite ends of said flat magnet, between the respective ends of said flat magnet and said scanner housing.

9. An MRI apparatus as claimed in claim 7 wherein said MRI scanner comprises a scanner housing, and wherein said actuator assembly comprises an actuator connected between a first end of said flat magnet, between said first end of said flat magnet and said scanner housing, and a spring connected to a second end of said flat magnet, opposite said first end, between said second end of said flat magnet and said scanner housing.

10. An MRI apparatus as claimed in claim 1 wherein said magnet assembly comprises two magnets disposed symmetrically with respect to each other on opposite sides of said imaging volume, and wherein said actuator assembly respectively actuates said two magnets so as to change said position of respective parts of each of said two magnets in antiphase relative to each other.

11. An MRI apparatus as claimed in claim 1 wherein said magnet is a flat magnet having a center axis, and wherein said actuator assembly alternates said position of said at least a part of said magnet by rotating said flat magnet around said center axis.

12. A method for operating a magnetic resonance imaging (MRI) apparatus, having an MRI scanner with an imaging volume therein, said method comprising:
operating a magnet to generate a basic magnetic field in the imaging volume of the MRI scanner, said basic magnetic field having a field strength that establishes a steady state of nuclei in a subject situated in the imaging volume;
with an actuator assembly in said MRI scanner, mechanically periodically alternating a position of at least a part of said magnet between two positions, so as to cause said at least part of said magnet to produce a time-varying gradient magnetic field that encodes magnetic resonance signals produced in said MRI scanner by nuclei in said subject that have been excited to resonance in an MRI data acquisition procedure executed by said MRI scanner; and with a computer, controlling operation of said MRI scanner and said actuator assembly in said MRI data acquisition procedure so as to enter said magnetic resonance signals into a memory organized as k-space along a time-varying trajectory defined by said encoding.

13. A method as claimed in claim 12 wherein the excited nuclei have a spin relaxation time associated therewith, and comprising alternating said position of said at least a part of said magnet by said actuator assembly takes place in a duration that is smaller than said spin relaxation time.

14. A method as claimed in claim 12 comprising alternating said position of said at least a part of said magnet by said actuator assembly takes place with a duration of less than 100 ms.

15. A method as claimed in claim 12 comprising alternating said position of said at least a part of said magnet by said actuator assembly with a frequency greater than 10 Hz.

16. A method as claimed in claim 12 comprising alternating said position of said at least a part of said magnet by said actuator assembly with a frequency in a range between 10 and 200 Hz.

17. A method as claimed in claim 12 comprising alternating said position of said at least a part of said magnet comprising alternating with a frequency greater than 15 kHz.

18. A method as claimed in claim 12 wherein said magnet is a flat magnet, and comprising alternating said position of parts of said flat magnet by said actuator assembly by tilting said flat magnet.

19. A method as claimed in claim 18 wherein said MRI scanner comprises a scanner housing, and by said actuator assembly said position of said at least a part of said flat magnet with two separate actuators respectively disposed at opposite ends of said flat part of said magnet, between the respective ends of said flat part of said magnet and said scanner housing.

20. A method as claimed in claim 18 wherein said MRI scanner comprises a scanner housing, and by said actuator assembly said position of said at least a part of said flat magnet with an actuator connected to a first end of said flat magnet, between said first end of said flat magnet and said scanner housing, and with a spring connected to a second end of said flat magnet, opposite said first end, between said second end of said flat magnet and said scanner housing.

21. A method as claimed in claim 12 wherein said magnet assembly comprises two magnet parts disposed symmetrically with respect to each other on opposite sides of said imaging volume, and, with said actuator assembly, respectively actuating said two magnet parts so as to change said position of each of said two magnet parts in antiphase relative to each other.

22. A method as claimed in claim 12 wherein said magnet is a flat magnet having a center axis, and comprising alternating said position of said at least a part of said magnet by rotating said flat magnet around said center axis.

* * * * *